United States Patent
Yao (10) Patent No.: US 10,162,702 B2
(45) Date of Patent: Dec. 25, 2018

(54) SEGMENTED ERROR CODING FOR BLOCK-BASED MEMORY

(71) Applicant: Lattice Semiconductor Corporation, Portland, OR (US)

(72) Inventor: Peng Yao, Fremont, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/011,785

(22) Filed: Feb. 1, 2016

(65) Prior Publication Data

US 2017/0220416 A1    Aug. 3, 2017

(51) Int. Cl.
| | |
|---|---|
| G06F 11/10 | (2006.01) |
| H03M 13/29 | (2006.01) |
| G11C 29/52 | (2006.01) |
| H03M 13/13 | (2006.01) |
| H03M 13/19 | (2006.01) |

(52) U.S. Cl.
CPC .......... *G06F 11/1068* (2013.01); *G11C 29/52* (2013.01); *H03M 13/2906* (2013.01); *G06F 11/1008* (2013.01); *G06F 11/1044* (2013.01); *H03M 13/13* (2013.01); *H03M 13/19* (2013.01)

(58) Field of Classification Search
CPC .. G06F 11/10; G06F 11/1008; G06F 11/1044; G06F 11/1068; G11C 29/52; H03M 13/05; H03M 13/13; H03M 13/19; H03M 13/2906

See application file for complete search history.

(56) References Cited

U.S. PATENT DOCUMENTS

| | | | |
|---|---|---|---|
| 4,852,100 A | 7/1989 | Christensen et al. | |
| 2013/0007574 A1* | 1/2013 | Langadi ............... | G06F 13/1673 |
| | | | 714/807 |

(Continued)

FOREIGN PATENT DOCUMENTS

| | | |
|---|---|---|
| WO | WO91/19253 A1 | 12/1991 |
| WO | WO2009/003995 A1 | 1/2009 |

OTHER PUBLICATIONS

M.Y. Hsiao, "A Class of Optimal Minimum Odd-Weight-Column SEC-DED Codes," IBM Journal of Research and Development, vol. 14, No. 4, Jul. 1970, pp. 395-401.

*Primary Examiner* — Kyle Vallecillo
*Assistant Examiner* — Christian M Dorman
(74) *Attorney, Agent, or Firm* — Haynes and Boone, LLP (57) ABSTRACT

In one embodiment, memory circuitry includes an error-correction code (ECC) encoder, memory, and an ECC decoder. The ECC encoder performs encoding, based on an ECC algorithm having an algorithm size, on an algorithm-size segment of input user data to generate a corresponding subset of parity data for the segment of input user data. The memory has input user data and corresponding parity data written based on a write data size and stored user data and corresponding stored parity data read based on a read data size. The ECC decoder performs decoding, based on the ECC algorithm, on an algorithm-size segment of retrieved user data and a corresponding subset of retrieved parity data, wherein the algorithm size is smaller than the write data size or the read data size. The memory circuitry enables conventional SEC-DED algorithms to be used when the write and read data sizes are different.

20 Claims, 3 Drawing Sheets

(56) References Cited

U.S. PATENT DOCUMENTS

| | | | | |
|---|---|---|---|---|
| 2013/0297986 A1* | 11/2013 | Cohen | ............... | G11C 29/52 |
| | | | | 714/763 |
| 2015/0121170 A1* | 4/2015 | Minzoni | ............ | G06F 11/1048 |
| | | | | 714/766 |
| 2016/0134307 A1* | 5/2016 | Hu | .................. | G11C 29/52 |
| | | | | 714/758 |
| 2016/0357630 A1* | 12/2016 | Kang | ................ | G11C 5/025 |
| 2017/0060681 A1* | 3/2017 | Halbert | ............ | G06F 11/1068 |

\* cited by examiner

| W | ... | U3F | U3E | U3D | U3C | U2F | U2E | U2D | U2C | U1F | U1E | U1D | U1C | UF | UE | UD | UC | P7 | P6 | R |
|---|---|---|---|---|---|---|---|---|---|---|---|---|---|---|---|---|---|---|---|---|
| | ... | U3F | U3E | U3D | U3C | U2F | U2E | U2D | U2C | U1F | U1E | U1D | U1C | UF | UE | UD | UC | P7 | P6 | |
| 1 | ... | U3B | U3A | U39 | U38 | U2B | U2A | U29 | U28 | U1B | U1A | U19 | U18 | UB | UA | U9 | U8 | P5 | P4 | 1 |
| | ... | U37 | U36 | U35 | U34 | U27 | U26 | U25 | U24 | U17 | U16 | U15 | U14 | U7 | U6 | U5 | U4 | P3 | P2 | |
| | ... | U33 | U32 | U31 | U30 | U23 | U22 | U21 | U20 | U13 | U12 | U11 | U10 | U3 | U2 | U1 | U0 | P1 | P0 | |
| | ... | U3F | U3E | U3D | U3C | U2F | U2E | U2D | U2C | U1F | U1E | U1D | U1C | UF | UE | UD | UC | P7 | P6 | |
| 0 | ... | U3B | U3A | U39 | U38 | U2B | U2A | U29 | U28 | U1B | U1A | U19 | U18 | UB | UA | U9 | U8 | P5 | P4 | 0 |
| | ... | U37 | U36 | U35 | U34 | U27 | U26 | U25 | U24 | U17 | U16 | U15 | U14 | U7 | U6 | U5 | U4 | P3 | P2 | |
| | ... | U33 | U32 | U31 | U30 | U23 | U22 | U21 | U20 | U13 | U12 | U11 | U10 | U3 | U2 | U1 | U0 | P1 | P0 | |
| | | EBR4 | | | | EBR3 | | | | EBR2 | | | | EBR1 | | | | EBR0 | | |

FIG. 3

| W | U3F | U3E | U3D | U3C | U3B | U3A | U39 | U38 | U37 | U36 | U35 | U34 | U33 | U32 | U31 | U30 | P5 | P4 | P3 | P2 | P1 | P0 | R |
|---|---|---|---|---|---|---|---|---|---|---|---|---|---|---|---|---|---|---|---|---|---|---|---|
| | · | · | · | · | · | · | · | · | · | · | · | · | · | · | · | · | · | · | · | · | · | · | · |
| 1 | U3F | U3E | U3D | U3C | U3B | U3A | U39 | U38 | U37 | U36 | U35 | U34 | U33 | U32 | U31 | U30 | P5 | P4 | P3 | P2 | P1 | P0 | 1 |
| | U2F | U2E | U2D | U2C | U2B | U2A | U29 | U28 | U27 | U26 | U25 | U24 | U23 | U22 | U21 | U20 | P5 | P4 | P3 | P2 | P1 | P0 | |
| | U1F | U1E | U1D | U1C | U1B | U1A | U19 | U18 | U17 | U16 | U15 | U14 | U13 | U12 | U11 | U10 | P5 | P4 | P3 | P2 | P1 | P0 | |
| | UF | UE | UD | UC | UB | UA | U9 | U8 | U7 | U6 | U5 | U4 | U3 | U2 | U1 | U0 | P5 | P4 | P3 | P2 | P1 | P0 | |
| 0 | U3F | U3E | U3D | U3C | U3B | U3A | U39 | U38 | U37 | U36 | U35 | U34 | U33 | U32 | U31 | U30 | P5 | P4 | P3 | P2 | P1 | P0 | 0 |
| | U2F | U2E | U2D | U2C | U2B | U2A | U29 | U28 | U27 | U26 | U25 | U24 | U23 | U22 | U21 | U20 | P5 | P4 | P3 | P2 | P1 | P0 | |
| | U1F | U1E | U1D | U1C | U1B | U1A | U19 | U18 | U17 | U16 | U15 | U14 | U13 | U12 | U11 | U10 | P5 | P4 | P3 | P2 | P1 | P0 | |
| | UF | UE | UD | UC | UB | UA | U9 | U8 | U7 | U6 | U5 | U4 | U3 | U2 | U1 | U0 | P5 | P4 | P3 | P2 | P1 | P0 | |
| | EBR5 | | | EBR4 | | | | | EBR3 | | | | | EBR2 | | | EBR1 | | EBR0 | | | | |

SEGMENTED ERROR CODING FOR BLOCK-BASED MEMORY

BACKGROUND

Field of the Invention

The present invention relates to electronics and, more specifically but not exclusively, to error coding, such as error detection and correction coding, for integrated circuitry (IC) memory.

Description of the Related Art

This section introduces aspects that may help facilitate a better understanding of the invention. Accordingly, the statements of this section are to be read in this light and are not to be understood as admissions about what is prior art or what is not prior art.

Memory data corruption, such as a single event upset (SEU), is unavoidable in EBR (embedded block RAM (random-access memory)) memory blocks of an integrated circuit, such as a field-programmable gate array (FPGA), which data corruption could be fatal to systems running on the IC chip. Error correction coding (ECC) with the capability of single-error correction and double-error detection (SEC-DED) was developed to make electronic systems resilient to data errors. When applied to memory, conventional SEC-DED codes assume that the size of the data written to memory is the same as the size of the data read from that memory.

SUMMARY

In some IC applications according to the disclosure, write data size is different from read data size, such that conventional SEC-DED coding and associated implementations cannot be applied. In one embodiment, the present invention is memory circuitry comprising an error-code (EC) encoder, memory, and an EC decoder. The EC encoder is configured to perform encoding, based on an EC algorithm having an algorithm size, on an algorithm-size segment of input user data to generate a corresponding subset of parity data for the segment of input user data. The memory is configured (i) to have input user data and corresponding parity data written into the memory based on a write data size corresponding to an amount of input user data written into the memory in a single write operation and (ii) to have stored user data and corresponding stored parity data read from the memory based on a read data size corresponding to an amount of stored user data read from the memory in a single read operation. The EC decoder is configured to (i) receive retrieved user data and corresponding retrieved parity data read from the memory and (ii) perform decoding, based on the EC algorithm, on an algorithm-size segment of retrieved user data and a corresponding subset of retrieved parity data, wherein the algorithm size is smaller than at least one of the write data size and the read data size.

In another embodiment, the present invention is a method for writing and reading data into and from memory. The method comprises performing encoding, based on an EC algorithm having an algorithm size, on an algorithm-size segment of input user data to generate a corresponding subset of parity data for the segment of input user data; writing input user data and corresponding parity data into the memory based on a write data size corresponding to an amount of input user data written to the memory in a single write operation; reading stored user data and corresponding stored parity data from the memory based on a read data size corresponding to an amount of stored user data read from the memory in a single read operation; and performing decoding, based on the EC algorithm, on an algorithm-size segment of retrieved user data read from the memory and a corresponding subset of retrieved parity data read from the memory, wherein the algorithm size is smaller than at least one of the write data size and the read data size.

In yet another embodiment, the present invention is a non-transitory machine-readable medium that stores data describing circuitry comprising a memory circuitry comprising an error-code (EC) encoder configured to perform encoding, based on an EC algorithm having an algorithm size, on an algorithm-size segment of input user data to generate a corresponding subset of parity data for the segment of input user data; memory configured (i) to have input user data and corresponding parity data written to the memory based on a write data size corresponding to an amount of input user data written into the memory in a single write operation and (ii) to have the stored user data and corresponding stored parity data read from the memory based on a read data size corresponding to an amount of stored user data read from the memory in a single read operation; and an EC decoder configured to (i) receive retrieved user data and corresponding retrieved parity data read from the memory and (ii) perform decoding, based on the EC algorithm, on an algorithm-size segment of retrieved user data and a corresponding subset of retrieved parity data, wherein the algorithm size is smaller than at least one of the write data size and the read data size.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
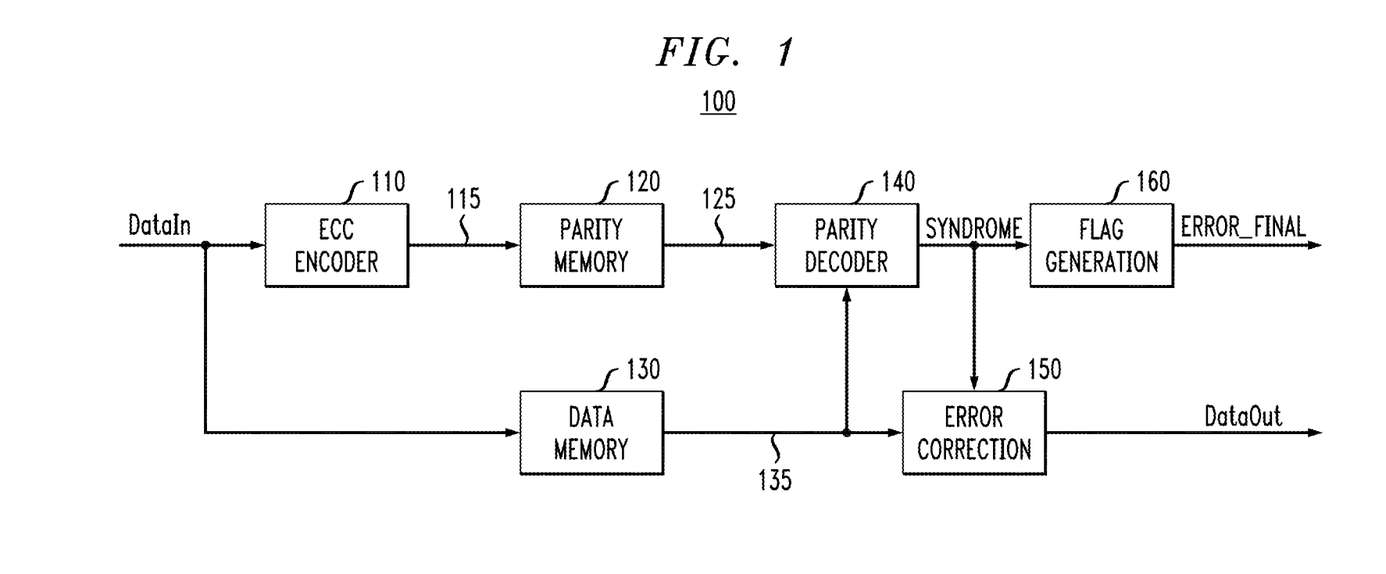
FIG. 1 is a simplified block diagram of memory circuitry, according to one embodiment of the invention.

FIG. 1 is a simplified block diagram of memory circuitry 100 in an integrated circuit, such as an FPGA, according to one embodiment of the invention. Memory circuitry 100 is capable of storing user data DataIn into data memory 130 and then reading out that stored user data. Herein, "user data" refers to the payload of useful memory, in contradistinction to parity data, and does not imply that such data has a particular source or origin. To handle the possibility of data corruption within data memory 130, memory circuitry 100 also includes an ECC encoder 110 that, during a memory write operation, uses a conventional SEC-DED algorithm to generate parity data 115 for the user data DataIn being stored in data memory 130 and stores that parity data 115 into parity memory 120.

In addition, memory circuitry 100 includes a parity decoder 140 that, during a memory read operation, applies the same SEC-DED algorithm to the user data 135 retrieved from the data memory 130 to determine whether any errors exist in the retrieved data. Note that, since data corruption can occur in either the parity memory 120 or the data memory 130 or both, data corruption errors may exist in either the retrieved parity data 125 or the retrieved user data 135 or both.

In a conventional SEC-DED algorithm, such as those based on Hamming codes, for each multi-bit set of user data DataIn that is stored in the data memory 130, a multi-bit set of parity data 115 are generated and stored in the parity memory 120. For example, for a 64-bit Hamming code, eight parity bits are generated for each 64 bits of user data, while, for a 16-bit Hamming code, six parity bits are generated for each 16 bits of user data. Hamming SEC-DED codes are described in M. Y. Hsiao, "A Class of Optimal Minimum Odd-weight-column SEC-DED Codes," SEC-DED Code, July 1970, the teachings of which are incorporated herein by reference.

Furthermore, if exactly two bit errors occur (i.e., exactly two bits in the set of retrieved user bits 135 and the corresponding set of retrieved parity bits 125 are corrupted), then the parity decoder 140 will be able to determine that two bit errors occurred, but not be able to identify which two bits were corrupted. If exactly one bit error occurs, then the parity decoder 140 will be able to identify which bit in the set of retrieved user bits 135 and the corresponding set of retrieved parity bits 125 was corrupted. Note that, if three or more bit errors occur, then the parity decoder 140 may or may not be able to determine that any bit errors occurred. The assumption in SEC-DED coding is that the probability of three or more bit errors occurring in a single set of retrieved user data 135 and its corresponding set of retrieved parity bits 125 can be assumed to be zero.

For each set n of k retrieved user bits 135 retrieved from data memory 130 and the corresponding set of r retrieved parity bits 125 retrieved from parity memory 120 (referred to collectively herein as "a set of retrieved data 125/135"), the parity decoder 140 generates an r-bit syndrome signal SYNDROMEn[r.1], where $2^{(r-1)} \geq k+r$ for Hamming SEC-DED codes. Depending on its value, the r-bit SYNDROMEn indicates one of three possibilities:

The parity decoder 140 detected no bit errors in the set of q+r retrieved data bits 125/135. In this case, the value of SYNDROMEn[r.1]=[0,0, . . . ,0], which indicates that no bit errors were detected;

The parity decoder 140 detected exactly one bit error in the set of q+r retrieved data bits 125/135. In this case, the value of SYNDROMEn[r.1] indicates that a single bit error was detected and identifies the location of that single bit error in the set; or The parity decoder 140 detected two bit errors in the set of q+r retrieved data bits 125/135. In this case, the value of SYNDROMEn[r.1] indicates that two bit errors were detected, but does not identify the location of those two bit errors in the set.

If the SYNDROMEn signal indicates that no bit errors were detected, then the error correction module 150 passes the nth set of retrieved user data 135 as the corresponding set of output user data DataOut without any change. If the SYNDROMEn signal indicates that a single bit error was detected in the set of retrieved parity data 125, then the error correction module 150 passes the nth set of retrieved user data 135 as the corresponding set of output user data DataOut without any change. If the SYNDROMEn signal indicates that a single bit error was detected in the nth set of retrieved user data 135, then error correction module 150 corrects that single bit error (i.e., by flipping the errored bit value from 1 to 0, or vice versa) in order to generate a set of output user data DataOut that matches the corresponding, original set of input user data DataIn. If the SYNDROMEn signal indicates that the parity decoder 140 detected two bit errors, then the nth set of retrieved user data 135 cannot be repaired.

Based on the SYNDROMEn[r1] signal, the flag generation module 160 generates a two-bit error signal ERRORn [1:0] that indicates the status of the nth set of retrieved data 125/135 according to Equations (1) and (2) as follows:

$$\text{ERROR}n[0] = \text{SYNDROME}n[r] \text{ XOR SYNDROME}n \\ [r-1] \text{ XOR } \ldots \text{ XOR SYNDROME}n[1] \quad (1)$$

$$\text{ERROR}n[1] = (\text{SYNDROME}n[r] \text{ OR SYNDROME}n \\ [r-1] \text{ OR } \ldots \text{ OR SYNDROME}n[1]) \text{ \&\& (ERROR}n[0] == 0) \quad (2)$$

where "XOR" represents the logical XOR operation, "OR" represents the logical OR operation, and "&&" represents the logical AND operation.

Based on Equations (1) and (2), the two-bit ERRORn signal can have the following values:

An ERRORn signal of [0,0] indicates that the nth set of retrieved data 125/135 has no bit errors;

An ERRORn signal of [0,1] indicates that the nth set of retrieved data 125/135 has exactly one bit error; and An ERRORn signal of [1,0] indicates that the nth set of retrieved data 125/135 has two bit errors.

Note that an ERRORn signal of [1,1] is not defined.

Flag generation module 160 then combines the N ERRORn signals for N consecutive sets n, n=1, . . . , N, of retrieved data 125/135 to generate a 2-bit final error signal ERROR_FINAL[1:0] according to Equations (3) and (4) as follows, where the value of the positive integer N depends on how memory circuitry 100 is configured, as described further below:

$$\text{ERROR\_FINAL}[1] = \text{ERROR1}[1] \text{ OR ERROR2}[1] \\ \text{OR } \ldots \text{ OR ERROR}N[1] \quad (3)$$

$$\text{ERROR\_FINAL}[0] = (\sim\text{ERROR\_FINAL}[1]) \text{ \&\& (ERROR1}[0] \text{ OR ERROR2}[0] \text{ OR } \ldots \text{ OR} \\ \text{ERROR}N[0]), \quad (4)$$

where "~" represents the "logical NOT" operation.

Based on Equations (3) and (4), the two-bit ERROR_FINAL signal can have the following values:

An ERROR_FINAL signal of [0,0] indicates that none of the N sets of retrieved data 125/135 had any bit errors and the corresponding N sets of output user data DataOut are valid;

An ERROR signal of [0,1] indicates that none of the N sets of retrieved data 125/135 had two bit errors, at least one set had exactly one bit error, and the corresponding N sets of output user data DataOut are valid; and An ERROR signal of [1,0] indicates that at least one of the N sets of retrieved data 125/135 had two bit errors, and the corresponding N sets of output user data DataOut are invalid.

Note that an ERROR_FINAL signal of [1,1] is not defined. If the ERROR_FINAL signal indicates that the corresponding N sets of output user data DataOut are invalid, then the on-chip or off-chip circuitry (not shown) that receives the ERROR_FINAL signal will know that that output user data should not be used and appropriate measures may be taken.

In certain integrated circuits, like some FPGAs, memory is implemented in separate dual-port EBR memory blocks, where the write data size can be, but does not have to be, different from the read data size.

Figure 2:
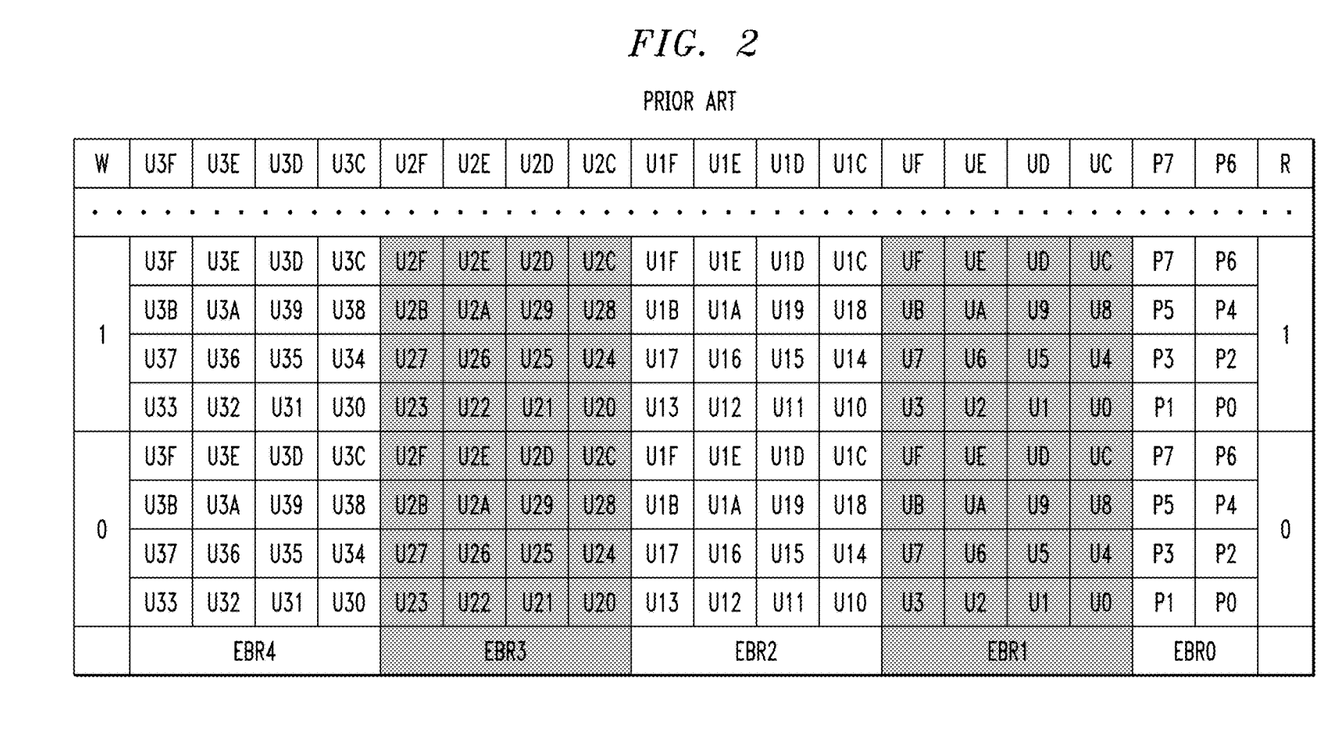
FIG. 2 is representation of a conventional data storage-and-retrieval memory scheme for EBR-based memory.

FIG. 2 is representation of a conventional data storage-and-retrieval memory scheme for EBR-based memory in which the write and read data sizes are the same. In the particular memory scheme of FIG. 2, each set of user data written to memory has 64 bits, and each set of user data read from memory also has 64 bits. According to this conventional memory scheme, the ECC encoder 110 applies a 64-bit SEC-DED algorithm to each 64-bit set of user data DataIn to generate eight parity bits 115 that get stored in the EBR-based memory 120, 130 along with the user data bits DataIn.

FIG. 2 shows portions of five EBR memory blocks EBR0-EBR4. According to this conventional memory scheme, the 64 bits U0-U3F of user data DataIn are stored in EBR blocks EBR1-EBR4, while the eight corresponding parity bits P0-P7 of parity data 115 are stored in EBR block EBR0. Note that the indices for user data bits DataIn are in hexadecimal format. In this memory scheme, EBR0 is part of parity memory 120 of FIG. 1, and EBR1-EBR4 are part of data memory 130 of FIG. 1.

For example, the first 16 bits U0-UF of word 0 of user data DataIn are stored in the first four rows of EBR1, the second 16 bits U10-U1F of word 0 of user data DataIn are stored in the first four rows of EBR2, the third 16 bits U20-U2F of word 0 of user data DataIn are stored in the first four rows of EBR3, the fourth 16 bits U30-U3F of word 0 of user data DataIn are stored in the first four rows of EBR4, and the corresponding 8 parity bits P0-P7 of parity data 115 are stored in the first four rows of EBR0.

Similarly, the first 16 bits U0-UF of word 1 of user data DataIn are stored in the second four rows of EBR1, the second 16 bits U10-U1F of word 1 of user data DataIn are stored in the second four rows of EBR2, the third 16 bits U20-U2F of word 1 of user data DataIn are stored in the second four rows of EBR3, the fourth 16 bits U30-U3F of word 1 of user data DataIn are stored in the second four rows of EBR4, and the corresponding 8 parity bits P0-P7 of parity data 115 are stored in the second four rows of EBR0. And so on.

According to this conventional memory scheme, each 64-bit word of user data DataIn (i.e., bits U0-U3F) and the corresponding eight parity bits P0-P7 of parity data 115 are stored into EBR0-EBR4 in a single write operation using a conventional 64-bit SEC-DED algorithm. Similarly, for each 64-bit word of stored user data, all 64 user bits U0-U3F and all corresponding eight parity bits P0-P7 are retrieved from EBR0-EBR4 in one read operation. In that case, the parity decoder 140 of FIG. 1 uses the same 64-bit SEC-DED algorithm to process the 72 bits of retrieved user and parity data 125/135 to determine whether any memory corruption has occurred. In that case, N=1, and Equations (1)-(4) may be written as Equations (5)-(8) as follows:

$$\text{ERROR1}[0]=\text{SYNDROME1}[r] \text{ XOR SYNDROME1}[r-1] \text{ XOR} \ldots \text{XOR SYNDROME1}[1] \quad (5)$$

$$\text{ERROR1}[1]=(\text{SYNDROME1}[r] \text{ OR SYNDROME1}[r-1] \text{ OR} \ldots \text{OR SYNDROME1}[1]) \text{ \&\& } (\text{ERROR1}[0]==0) \quad (6)$$

$$\text{ERROR\_FINAL}[1]=\text{ERROR1}[1] \quad (7)$$

$$\text{ERROR\_FINAL}[0]=(\sim\text{ERROR\_FINAL}[1]) \text{ \&\& } (\text{ERROR1}[0]) \quad (8)$$

If a data storage-and-retrieval memory scheme is employed in which the data read size is smaller than the 64-bit data write size, then the conventional 64-bit SEC-DED algorithm cannot be employed. For example, if the data read size is 16 bits, then error correction and/or detection cannot be employed during each read operation for the data stored in the EBR-based memory scheme of FIG. 2. Such a 16-bit read operation of the first row of the EBR blocks would retrieve parity bits P0-P1 and user bits U0-U3, U10-U13, U20-U23, and U30-U33. Not only are these 16 user bits not contiguous, but the two parity bits cannot be used to perform error correction and/or detection on those 16 user bits.

The present invention supports data storage-and-retrieval memory schemes that enable ECC to be employed even when the read data size is different from the write data size. According to certain embodiments of the present invention, the ECC algorithm is applied to sets of user data that are smaller than at least one of the write data size and the read data size. For example, in one possible embodiment, the write data size is 64 bits, the read data size is 16 bits, and the ECC algorithm size is also 16 bits, such that the ECC algorithm size (i.e., 16 bits) is smaller than the write data size (i.e., 64 bits).

Figure 3:
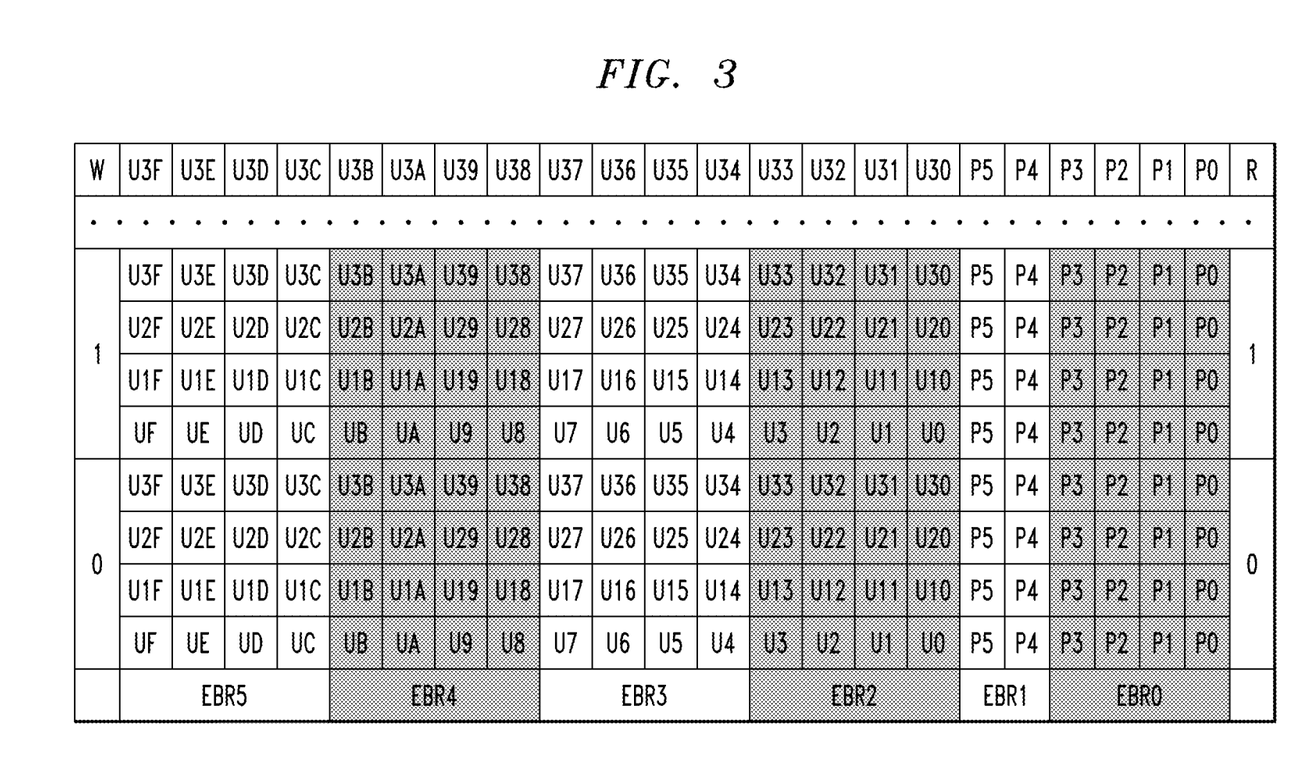
FIG. 3 is representation of a data storage-and-retrieval memory scheme for EBR-based memory, according to one embodiment of the invention.

FIG. 3 is representation of a data storage-and-retrieval memory scheme for EBR-based memory in which the write data size is 64 bits, the read data size is 16 bits, and the ECC algorithm size is also 16 bits, according to one embodiment of the invention. According to this memory scheme, the ECC encoder 110 applies a conventional 16-bit SEC-DED algorithm to each 16-bit segment of each 64-bit word of user data DataIn to generate six parity bits of parity data 115 that get stored in the EBR-based memory 120, 130 along with the 16-bit segment of user data DataIn.

In one possible implementation of a conventional 16-bit SEC-DED algorithm, the ECC encoder 110 generates a 6-bit parity data vector PARITY[6:1] for a 16-bit user data vector USER[16:1] based on Equation (9) as follows:

$$\text{PARITY}=H_P * \text{USER} \quad (9)$$

where "*" represent matrix multiplication, and $H_P$ is the parity matrix given by Equation (10) as follows:

$$H_P = \begin{bmatrix} 1 & 1 & 1 & 1 & 1 & 0 & 0 & 0 & 0 & 1 & 0 & 0 & 0 & 1 & 0 \\ 1 & 1 & 0 & 0 & 0 & 1 & 1 & 1 & 1 & 0 & 0 & 1 & 0 & 0 & 0 \\ 1 & 0 & 0 & 0 & 1 & 0 & 1 & 1 & 1 & 0 & 0 & 0 & 0 & 1 & 1 \\ 0 & 0 & 0 & 0 & 0 & 1 & 1 & 0 & 0 & 1 & 1 & 1 & 0 & 1 & 1 \\ 0 & 1 & 0 & 1 & 0 & 0 & 0 & 1 & 0 & 1 & 1 & 1 & 1 & 0 & 0 \\ 0 & 0 & 1 & 1 & 1 & 1 & 0 & 0 & 1 & 0 & 0 & 1 & 1 & 0 & 0 & 1 \end{bmatrix} \quad (10)$$

FIG. 3 shows portions of six EBR memory blocks EBR0-EBR5. According to this memory scheme, the 64 bits U0-U3F of each word of user data DataIn are stored in EBR blocks EBR2-EBR5, while the six bits P0-P5 of parity data 115 for each 16 bits of user data (i.e., a total of 24 parity bits for each word of user data) are stored in EBR blocks EBR0 and EBR1. In this memory scheme, EBR0-EBR1 are part of parity memory 120 of FIG. 1, and EBR2-EBR5 are part of data memory 130 of FIG. 1. To write a 64-bit user-data word in a single write operation, the ECC encoder 110 of FIG. 1 performs four different ECC encoding operations: one for each 16-bit segment of user data DataIn to generate a corresponding 6-bit subset of parity data 115, and all 64 bits of user data DataIn and all corresponding 24 bits of parity data 115 are stored into EBR0-EBR5.

For example, the first four bits U0-U3 of word 0 of user data DataIn are stored in the first row of EBR2, the second four bits U4-U7 of word 0 of user data DataIn are stored in the first row of EBR3, the third four bits U8-UB of word 0 of user data DataIn are stored in the first row of EBR4, the fourth four bits UC-UF of word 0 of user data DataIn are stored in the first row of EBR5, the corresponding first four parity bits P0-P3 of parity data 115 are stored in the first row of EBR0, and the corresponding last two parity bits P4-P5 of parity data 115 are stored in the first row of EBR1.

Similarly, the second 16 bits U10-U1F of word 0 of user data DataIn are stored in the second row of EBR2-EBR5, while the corresponding six parity bits P0-P5 of parity data 115 are stored in the second row of EBR0-EBR1. And so on for the third and fourth 16-bit segments of word 0 of user data DataIn and their two corresponding 6-bit subsets of parity data 115, and so on for the 64-bit set of word 1 of user data DataIn and its corresponding 24 bits of parity data 115, and so on.

Note that this memory scheme employs a version of scrambled-bit distribution, in which the user data DataIn is not contiguously stored in the EBRs as was the case in the memory scheme of FIG. 2. For example, in this memory scheme, EBR2 stores sixteen bits of non-contiguous user data DataIn, i.e., user bits U0-U3, U10-U13, U20-U23, and U30-U33.

According to this memory scheme, a 64-bit word of stored user data is retrieved by sequentially reading and ECC decoding each segment of 16 user bits and its corresponding six parity bits P0-P7 in four successive read operations based on the 16-bit SEC-DED algorithm of Equations (9) and (10).

In particular, for the nth 22-bit retrieved data vector DATAn[22:1], the parity decoder 140 generates a 6-bit SYNDROMEn[6:1] vector according to Equation (11) as follows:

$$\text{SYNDROME}n = H * \text{DATA}n, \quad (11)$$

where:

$$H = \begin{bmatrix} 1 & 1 & 1 & 1 & 1 & 0 & 0 & 0 & 0 & 1 & 0 & 0 & 0 & 1 & 0 & 1 & 0 & 0 & 0 & 0 & 0 \\ 1 & 1 & 1 & 0 & 0 & 0 & 1 & 1 & 1 & 1 & 0 & 0 & 1 & 0 & 0 & 0 & 0 & 1 & 0 & 0 & 0 & 0 \\ 1 & 0 & 0 & 0 & 1 & 0 & 1 & 1 & 1 & 0 & 0 & 0 & 0 & 1 & 1 & 1 & 0 & 0 & 1 & 0 & 0 & 0 \\ 0 & 0 & 0 & 0 & 0 & 1 & 1 & 0 & 0 & 1 & 1 & 1 & 0 & 1 & 1 & 1 & 0 & 0 & 0 & 1 & 0 & 0 \\ 0 & 1 & 0 & 1 & 0 & 0 & 0 & 1 & 0 & 1 & 1 & 1 & 1 & 0 & 0 & 0 & 0 & 0 & 0 & 0 & 1 & 0 \\ 0 & 0 & 1 & 1 & 1 & 1 & 0 & 0 & 1 & 0 & 0 & 1 & 1 & 0 & 0 & 1 & 0 & 0 & 0 & 0 & 0 & 1 \end{bmatrix} \quad (12)$$

and DATAn[22:1] is the concatenation {USERn[16:1], PARITYn[6:1]} of a 16-bit vector USERn[16:1] of retrieved user data 135 and the corresponding six-bit vector PARITYn[6:1] of retrieved parity data 125.

The error correction module 150 uses the 6-bit SYNDROMEn vector to perform ECC decoding on the 16-bit USERn vector to generate a 16-bit DATAOUTn vector of output user data DataOut according to Equations (13) and (14) as follows:

$$\text{MASK}n[16:1] = \text{SYNDROME}n[6:1] * H_P^T \quad (13)$$

$$\text{DATAOUT}n[16:1] = \text{MASK}n[16:1] \text{ XOR } \text{USER}n[16:1], \quad (14)$$

where $H_P^T$ is the transpose of the parity matrix $H_P$ of Equation (10).

The flag generation module 160 uses the same 6-bit SYNDROMEn vector to generate a 2-bit ERRORn signal for the 22 bits of retrieved data 125/135 using Equations (1) and (2).

In particular, in the first read operation, the 16 user bits U0-UF and the corresponding six parity bits P0-P5 are retrieved from the first row of EBR0-EBR5, the parity decoder 140 of FIG. 1 generates a 6-bit SYNDROME1 vector for those 22 bits of retrieved data 125/135, the error correction module 150 generates a 16-bit DATAOUTPUT1 vector, and the flag generation module 160 generates a 2-bit ERROR1 signal.

In the second read operation, the 16 user bits U10-U1F and the corresponding six parity bits P0-P5 are retrieved from the second row of EBR0-EBR5, the parity decoder 140 generates a 6-bit SYNDROME2 vector for those 22 bits of retrieved data 125/135, the error correction module 150 generates a 16-bit DATAOUTPUT2 vector, and the flag generation module 160 generates a 2-bit ERROR2 signal. And so on for the third and fourth read operations. After all four read operations have been completed, ECC decoding will have been applied to the entire 64-bit word of retrieved user data 135.

After the entire 64-bit word of retrieved user data 135 has been ECC decoded, the flag generation module 160 generates a 2-bit ERROR_FINAL signal from the four error signals ERROR1, ERROR2, ERROR3, and ERROR4 based on Equations (3) and (4) as follows:

ERROR_FINAL[1]=ERROR1[1] OR ERROR2[1]
　OR ERROR3[1] OR ERROR4[1]　　　　　　(15)

ERROR_FINAL[0]=(~ERROR_FINAL[1]) && (ERROR1[0] OR ERROR2[0] OR ERROR3[0] OR ERROR4[0]),　　　　　　(16)

Note that the memory scheme of FIG. 3 can successfully correct up to four different bit errors for a given 64-bit word of user data (i.e., up to one bit error per row of EBR memory), while the memory scheme of FIG. 2 could successfully correct only one bit error per 64-bit word of user data.

Note further that the same pattern of storing data as shown in FIG. 3 can be used for a data storage-and-retrieval memory scheme in which the write data size and the read data size are both 64 bits, while the ECC algorithm size is only 16 bits, such that the ECC algorithm size is smaller than both the write data size and the read data size. According to this memory scheme, to write a 64-bit user-data word, the ECC encoder 110 of FIG. 1 performs four different ECC encoding operations: one for each 16-bit segment of user data to generate a corresponding 6-bit subset of parity data, and all 64 bits of user data and all corresponding 24 bits of parity data are stored into EBR0-EBR5 in a single write operation. To read a 64-bit user-data word, all 64 user-data bits and the corresponding 24 bits of parity data are retrieved in a single read operation, and the parity decoder 140 of FIG. 1 performs four different ECC decoding operations: one for each 16-bit segment of retrieved user data and its corresponding six bits of parity data. Note that this memory scheme can also successfully correct up to four different bit errors for a given 64-bit word of user data (i.e., up to one bit error per row).

The same pattern of storing data as shown in FIG. 3 can also be used for a data storage-and-retrieval memory scheme in which the write data size is 16 bits, the read data size is 64 bits, and the ECC algorithm size is also 16 bits, such that the ECC algorithm size is smaller than the read data size. According to this memory scheme, to write a 64-bit user-data word, the ECC encoder 110 of FIG. 1 performs four different ECC encoding operations: one for each 16-bit segment of user data to generate a corresponding 6-bit subset of parity data, and all 64 bits of user data and all corresponding 24 bits of parity data are stored into EBR0-EBR5 in four different write operations: each write operation writing a different 16-bit segment of user data into EBR2-EBR5 and the corresponding six bits of parity data into EBR0-EBR1. To read a 64-bit user-data word, all 64 bits of a user-data word and the corresponding 24 bits of parity data are retrieved in a single read operation, and the parity decoder 140 of FIG. 1 performs four different ECC decoding operations: one for each 16-bit segment of retrieved user data and its corresponding six bits of parity data. Note that this memory scheme can also successfully correct up to four different bit errors for a given 64-bit word of user data (i.e., up to one bit error per row).

In general, data storage-and-retrieval memory schemes of the present invention have the common feature that the size of the ECC algorithm is smaller than at least one of the write data size and the read data size. For each such memory scheme, each read operation retrieves at least one segment of user data and at least one corresponding subset of parity data, where each subset of parity data is sufficient to apply ECC decoding for the corresponding segment of user data.

Although the invention has been described in the context of memory configured in EBR memory blocks, the invention can also be implemented in the context of other suitable memory architectures.

Although the invention has been described in the context of Hamming-type SEC-DED algorithms, the invention can also be implemented in the context of other suitable types of SEC-DED algorithms and even error-code (EC) algorithms providing greater or lesser error-detection and/or error-correction capabilities than double-error detection and single-error correction.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing modules in a software program. Such software may be employed in, for example, a digital signal processor, micro-controller, general-purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Embodiments of the invention can be manifest in the form of methods and apparatuses for practicing those methods. Embodiments of the invention can also be manifest in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Embodiments of the invention can also be manifest in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits Any suitable processor-usable/readable or computer-usable/readable storage medium may be utilized. The storage medium may be (without limitation) an electronic, magnetic, optical, electromagnetic, infrared, or semiconductor system, apparatus, or device. A more-specific, non-exhaustive list of possible storage media include a magnetic tape, a portable computer diskette, a hard disk, a random access memory (RAM), a read-only memory (ROM), an erasable programmable read-only memory (EPROM) or Flash memory, a portable compact disc read-only memory (CD-ROM), an optical storage device, and a magnetic storage device. Note that the storage medium could even be paper or another suitable medium upon which the program is printed, since the program can be electronically captured via, for instance, optical scanning of the printing, then compiled, interpreted, or otherwise processed in a suitable manner including but not limited to optical character recognition, if necessary, and then stored in a processor or computer memory. In the context of this disclosure, a suitable storage medium may be any medium that can contain or store a program for use by or in connection with an instruction execution system, apparatus, or device.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising memory circuitry comprising:
    an error-code (EC) encoder configured to perform encoding, based on an EC algorithm having an algorithm size, on an algorithm-size segment of input user data to generate a corresponding subset of parity data for the segment of the input user data;
    memory configured (i) to have the input user data and corresponding parity data written into the memory based on a write data size, wherein the written data size is an amount of the input user data written into the memory in a single write operation and (ii) to have stored user data and corresponding stored parity data read from the memory based on a read data size, wherein the read data size is an amount of the stored user data read from the memory in a single read operation; and
    an EC decoder configured to (i) receive retrieved user data and corresponding retrieved parity data read from the memory and (ii) perform decoding, based on the EC algorithm, on an algorithm-size segment of retrieved user data and a corresponding subset of retrieved parity data, wherein the algorithm size is smaller than at least one of the write data size or the read data size.

2. The apparatus of claim 1, wherein:
    the write data size is equal to the read data size; and
    the algorithm size is smaller than both the write data size and the read data size.

3. The apparatus of claim 1, wherein:
    the write data size is greater than the read data size; and
    the algorithm size is smaller than or equal to the read data size.

4. The apparatus of claim 1, wherein:
    the write data size is smaller than the read data size; and
    the algorithm size is smaller than or equal to the write data size.

5. The apparatus of claim 1, wherein the EC algorithm is an error-correction coding (ECC) algorithm.

6. The apparatus of claim 5, wherein the ECC algorithm is a single-error correction, double-error detection (SEC-DED) algorithm.

7. The apparatus of claim 6, wherein the SEC-DED algorithm is based on a Hamming code.

8. The apparatus of claim 6, further comprising an error correction module configured to correct up to one bit error for each algorithm-size segment of retrieved user data and the corresponding subset of retrieved parity data.

9. The apparatus of claim 6, further comprising a flag generation module configured to generate an error signal indicating the status of N algorithm-size segments of retrieved user data and the corresponding subsets of retrieved parity data, where N is a positive integer greater than 1.

10. The apparatus of claim 1, wherein:
    the memory is EBR (embedded block RAM (random access memory)) memory comprising a plurality of EBR memory blocks; and
    multiple EBR memory blocks are configured to store each algorithm-size segment of input user data and corresponding subset of parity data in a single row across the multiple EBR memory blocks.

11. The apparatus of claim 10, wherein:
    a first subset of the multiple EBR memory blocks is configured to store each algorithm-size segment of input user data in the single row across the first subset of the multiple EBR memory blocks; and
    a remaining subset of the multiple EBR memory blocks is configured to store the corresponding subset of parity data in the single row across the remaining subset of the multiple EBR memory blocks.

12. The apparatus of claim 11, wherein, if the write data size is 64 bits and the read data size and the algorithm size are both 16 bits, then:
    the EC encoder is configured to perform encoding, based on a SEC-DED algorithm having the algorithm size, on a 16-bit segment of input user data to generate a corresponding 6-bit subset of parity data for the 16-bit segment of input user data;
    the first subset of the multiple EBR memory blocks is configured to store the 16-bit segment of input user data in a single row across the first subset of the multiple EBR memory blocks; and
    the remaining subset of the multiple EBR memory blocks is configured to store the corresponding 6-bit subset of parity data in the single row across the remaining subset of the multiple EBR memory blocks; and
    the EC decoder is configured to (i) receive 16 bits of retrieved user data and a corresponding 6 bits of retrieved parity data read from the single row and (ii) perform decoding, based on the SEC-DED algorithm, on the 16-bit segment of retrieved user data and the corresponding 6-bit subset of retrieved parity data, such that the EC decoder is configured to correct up to four bit errors for a 64-bit set of retrieved user data.

13. The apparatus of claim 1, wherein the memory circuitry is incorporated into circuitry of a field-programmable gate array (FPGA).

14. The apparatus of claim 1, wherein:
the EC algorithm is a SEC-DED algorithm based on a Hamming code;
further comprising:
an error correction module configured to correct up to one bit error for each algorithm-size segment of retrieved user data and the corresponding subset of retrieved parity data; and
a flag generation module configured to generate an error signal indicating the status of N algorithm-size segments of retrieved user data and the corresponding subsets of retrieved parity data, where N is a positive integer greater than 2;
the memory is EBR memory comprising a plurality of EBR memory blocks;
multiple EBR memory blocks are configured to store each algorithm-size segment of input user data and corresponding subset of parity data in a single row across the multiple EBR memory blocks, wherein:
a first subset of the multiple EBR memory blocks is configured to store each algorithm-size segment of input user data in the single row across the first subset of the multiple EBR memory blocks; and
a remaining subset of the multiple EBR memory blocks is configured to store the corresponding subset of parity data in the single row across the remaining subset of the multiple EBR memory blocks; and
the memory circuitry is implemented in an FPGA.

15. A method for writing and reading data into and from memory, the method comprising:
performing encoding, based on an EC algorithm having an algorithm size, on an algorithm-size segment of input user data to generate a corresponding subset of parity data for the segment of the input user data;
writing the input user data and corresponding parity data into the memory based on a write data size, wherein the written data size is an amount of the input user data written to the memory in a single write operation;
reading stored user data and corresponding stored parity data from the memory based on a read data size, wherein the read data size is an amount of the stored user data read from the memory in a single read operation; and
performing decoding, based on the EC algorithm, on an algorithm-size segment of retrieved user data read from the memory and a corresponding subset of retrieved parity data read from the memory, wherein the algorithm size is smaller than at least one of the write data size or the read data size.

16. The method of claim 15, wherein:
the memory is EBR memory comprising a plurality of EBR memory blocks; and
writing the input user data and the corresponding parity data comprises storing each algorithm-size segment of input user data and corresponding subset of parity data in a single row across the multiple EBR memory blocks.

17. The method of claim 16, wherein writing the input user data and the corresponding parity data comprises:
storing each algorithm-size segment of input user data in the single row across the first subset of the multiple EBR memory blocks; and
storing the corresponding subset of parity data in the single row across the remaining subset of the multiple EBR memory blocks.

18. A non-transitory machine-readable medium that stores data describing circuitry comprising a memory circuitry comprising:
an error-code (EC) encoder configured to perform encoding, based on an EC algorithm having an algorithm size, on an algorithm-size segment of input user data to generate a corresponding subset of parity data for the segment of the input user data;
memory configured (i) to have the input user data and corresponding parity data written to the memory based on a write data size, wherein the written data size is an amount of the input user data written into the memory in a single write operation and (ii) to have the stored user data and corresponding stored parity data read from the memory based on a read data size, wherein the read data size is an amount of stored user data read from the memory in a single read operation; and
an EC decoder configured to (i) receive retrieved user data and corresponding retrieved parity data read from the memory and (ii) perform decoding, based on the EC algorithm, on an algorithm-size segment of retrieved user data and a corresponding subset of retrieved parity data, wherein the algorithm size is smaller than at least one of the write data size or the read data size.

19. The non-transitory machine-readable medium of claim 18, wherein:
the memory is EBR memory comprising a plurality of EBR memory blocks; and
multiple EBR memory blocks are configured to store each algorithm-size segment of input user data and corresponding subset of parity data in a single row across the multiple EBR memory blocks.

20. The non-transitory machine-readable medium of claim 19, wherein:
a first subset of the multiple EBR memory blocks is configured to store each algorithm-size segment of input user data in the single row across the first subset of the multiple EBR memory blocks; and
a remaining subset of the multiple EBR memory blocks is configured to store the corresponding subset of parity data in the single row across the remaining subset of the multiple EBR memory blocks.

* * * * *